United States Patent
Baumer et al.

(10) Patent No.: US 11,737,199 B2
(45) Date of Patent: Aug. 22, 2023

(54) DEVICE AND METHOD FOR MEASURING THE BEAM ANGLE OF A LIGHT BEAM GUIDED BY A BEAM GUIDING OPTICAL UNIT

(71) Applicant: Carl Zeiss SMT GmbH, Oberkochen (DE)

(72) Inventors: Florian Baumer, Oberkochen (DE); Matthias Manger, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 310 days.

(21) Appl. No.: 17/217,295

(22) Filed: Mar. 30, 2021

(65) Prior Publication Data
US 2021/0219409 A1    Jul. 15, 2021

Related U.S. Application Data

(63) Continuation of application No. PCT/EP2019/071811, filed on Aug. 14, 2019.

(30) Foreign Application Priority Data

Oct. 2, 2018 (DE) .......................... 102018124342.1

(51) Int. Cl.
*H05G 2/00* (2006.01)
*G02B 7/28* (2021.01)
(Continued)

(52) U.S. Cl.
CPC ............. *H05G 2/008* (2013.01); *G02B 7/287* (2013.01); *G02B 27/126* (2013.01); *G03F 7/70033* (2013.01)

(58) Field of Classification Search
CPC ...... H05G 2/008; G02B 7/287; G02B 27/126; G03F 7/70033
See application file for complete search history.

(56) References Cited

U.S. PATENT DOCUMENTS

| 2012/0112101 A1 | 5/2012 | Kleinschmidt |
| 2017/0122803 A1 | 5/2017 | Manger et al. |

FOREIGN PATENT DOCUMENTS

| DE | 102010050947 A1 | 5/2012 |
| DE | 102012212354 A1 | 1/2014 |
| DE | 102014203141 A1 | 8/2015 |

OTHER PUBLICATIONS

GPTO—Office Action, with translation thereof, for corresponding DE Appl No. 10 2018 124 342.1 dated Jun. 17, 2019.
(Continued)

*Primary Examiner* — Nicole M Ippolito
*Assistant Examiner* — Hanway Chang
(74) *Attorney, Agent, or Firm* — Fish & Richardson P.C.

(57) ABSTRACT

An apparatus includes a light intensity sensor arrangement, a focusing unit for focusing the light beam at a specified location on the light intensity sensor arrangement, and an adjustment unit which adjusts a relative position of the intensity centroid of the light beam in relation to a specified location on the light intensity sensor arrangement when there is a change in the beam angle present upon entry in the apparatus. The adjustment unit is configured to keep the relative position of the intensity centroid of the light beam in relation to the specified location on the light intensity sensor arrangement constant up to a specified maximum deviation. The maximum deviation corresponds to half the mean beam diameter upon incidence on the light intensity sensor arrangement.

20 Claims, 8 Drawing Sheets

(51) Int. Cl.
  *G02B 27/12* (2006.01)
  *G03F 7/20* (2006.01)
  *G03F 7/00* (2006.01)

(56) References Cited

OTHER PUBLICATIONS

Grafström, S. et al.: Fast laser beam position control with submicroradian precision, In: Optics communications, 65, 15.01.1988, 2, pp. 121-126.
IPRP, with translation thereof, for corresponding Appl No. PCT/EP2019/071811, dated Mar. 23, 2021.
Translation of International Search Report for corresponding international application No. PCT/EP2019/071811, dated Nov. 13, 2019.
European Office Action, with translation thereof, for corresponding EP Appl No. 19 759 516.8, dated Mar. 22, 2023.

DEVICE AND METHOD FOR MEASURING THE BEAM ANGLE OF A LIGHT BEAM GUIDED BY A BEAM GUIDING OPTICAL UNIT

CROSS-REFERENCE TO RELATED APPLICATIONS

The present application is a continuation of, and claims benefit under 35 USC 120 to, international application PCT/EP2019/071811, filed Aug. 14, 2019, which claims benefit under 35 USC 119 of German Application No. 10 2018 124 342.1, filed on Oct. 2, 2018. The entire disclosure of these applications are incorporated by reference herein.

FIELD

The disclosure relates to an apparatus and a method for measuring the beam angle of a light beam guided by a beam guiding optical unit. The disclosure can be used, for example, when monitoring an excitation laser beam in an EUV plasma source. However, applications of the disclosure are not restricted thereto but include, for example, various applies cations in which the quickest possible position capture and monitoring of a light beam or laser beam, such as when processing material or determining the position of objects relative to the focal position of an imaging optical unit, is desirable.

BACKGROUND

In addition to camera-based approaches, known approaches for measuring the beam angle or capturing the propagation direction of a light beam include, for example, the use of light intensity sensor arrangements in the form of commercially available quadrants detectors.

Figure 7:
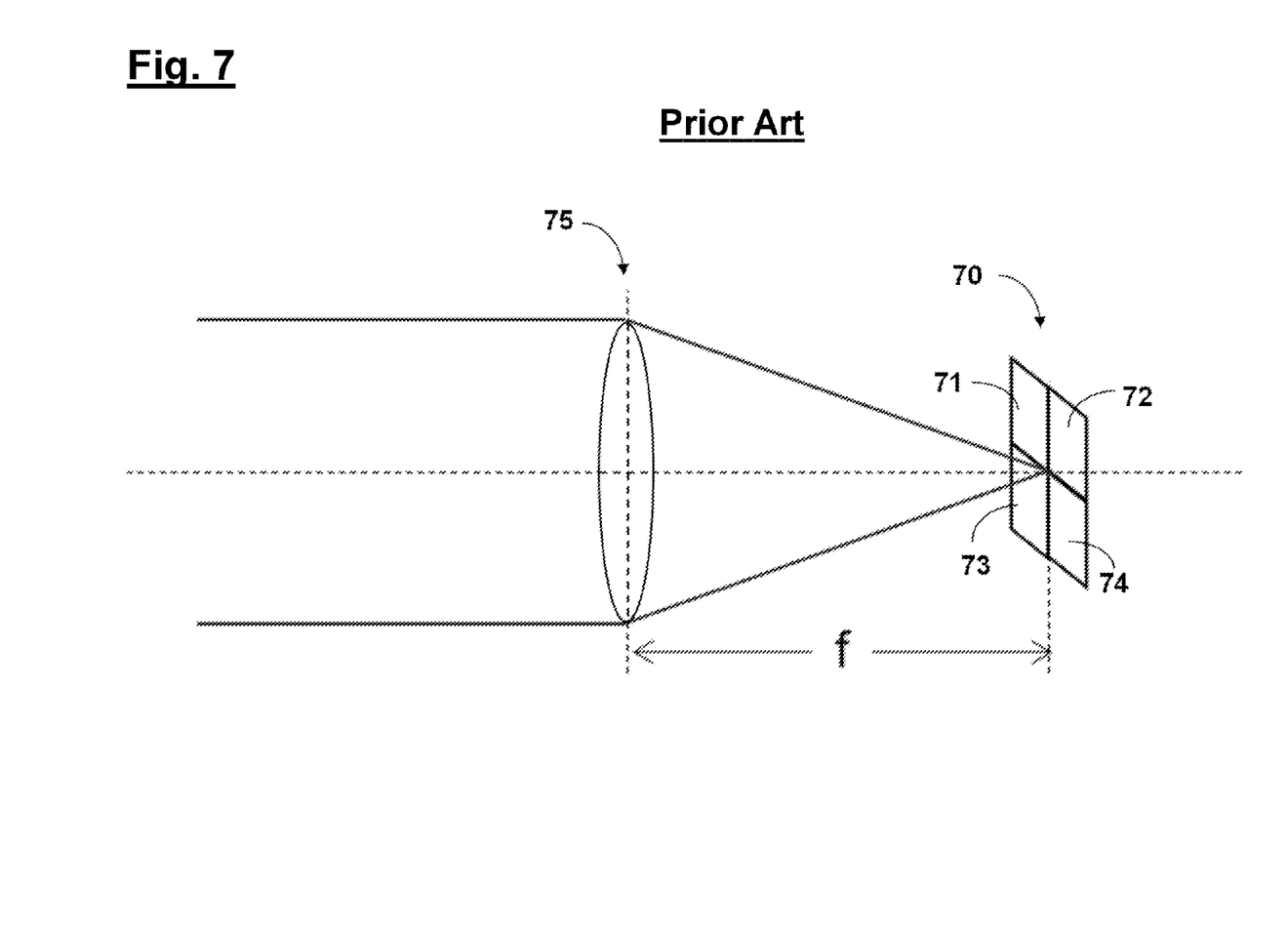
FIG. 7 shows a schematic illustration for elucidating a conventional apparatus for measuring the beam angle.

FIG. 7 shows a measurement set up, possible as a matter of principle, in a purely schematic illustration. Here, a light beam to be measured with respect to its propagation direction or its beam angle relative to the optical system axis is focused by way of a focusing unit 75 at a quadrant detector 70 that is arranged in the image-side focal plane of this focusing unit 75. The quadrant detector 70 is assembled from four light intensity sensors 71-74, with the sought-after beam angle or the propagation direction of the light beam being determined from the combination by calculation of the light intensities measured by these light intensity sensors 71-74. Arranging the quadrant detector 70 at a distance of one focal length from the focusing unit 75 can be advantageous in that the measurement signal is insensitive to a lateral displacement of the laser beam to be measured and hence only the beam propagation direction is in fact measured. In principle, measurement bandwidth up into the gigahertz range can be obtained using semiconductor-based detectors as are used in quadrants detectors while camera-based detectors in the infrared range only reach measurement bandwidths of 1 kHz or less.

Even if the above-described measurement principle facilitates, in principle, a relatively fast capture of angle or position of the light beam, for example in comparison with camera-based approaches, an issue of the measurement principle described that can arise in practice lies in the comparatively small measurement region that is limited by the spot size of the light beam on the quadrant detector. Focusing the light beam on comparatively small mean beam diameters or spot sizes of the order of less than 100 µm on the quadrant detector can have a consequence that even in the case of the comparatively small changes in beam angle the beam migrates out of the center of the quadrant detector and ultimately there is no longer a measurement signal that can be evaluated for determining the position available as soon as the spot is only still incident on one of the light intensity sensors 71-74.

Approaches for overcoming the above-described problem by way of diffraction-based expansion of the light beam by the use of an aperture stop can be limited, in turn, inasmuch as only a comparatively small component of the light beam (e.g., 10% of the overall power) contributes to the actual measurement signal, with the consequence that this component may no longer be sufficiently representative for the entire light beam and the measurement signal might instead be dominated by local wavefront inclinations, for example. A further issue related to the use of an aperture stop can be that the arrangement becomes sensitive to a lateral displacement of the laser beam; expressed differently, it might no longer possible to readily distinguish whether a spot movement on the quadrant detector is caused by a change in the beam propagation direction or by a change in the lateral position of the laser beam.

Regarding known disclosures, reference is made by way of example to DE 10 2014 203 141 A1 and DE 10 2012 212 354 A1.

SUMMARY

The present disclosure seeks to provide an apparatus and a method for measuring the beam angle of a light beam guided by a beam guiding optical unit, which facilitate a beam angle measurement that is as accurate as possible over a measurement region that is as large as possible, while avoiding the above-described disadvantages.

An apparatus for measuring the beam angle includes: a light intensity sensor arrangement; a focusing unit for focusing the light beam at a specified location on the light intensity sensor arrangement; and an adjustment unit which adjusts a relative position of the intensity centroid of the light beam in relation to a specified location on the light intensity sensor arrangement when there is a change in the beam angle present upon entry in the apparatus, wherein the adjustment unit is configured to keep the relative position of the intensity centroid of the light beam in relation to the specified location on the light intensity sensor arrangement constant up to a specified maximum deviation, and wherein this maximum deviation corresponds to half the mean beam diameter upon incidence on the light intensity sensor arrangement.

The disclosure involves the concept of, during the beam angle measurement of a light beam, maintaining the light beam to be measured substantially at a specified position of the light intensity sensor arrangement at all times by way of the active adjustment of a component situated in the optical beam path of the light beam (which component could be the light intensity sensor arrangement itself, the focusing unit or else a diffraction optical unit located in the beam path) and thus avoiding measurement range restrictions which emerge from the light beam or laser spot "migrating out" of the center of a quadrant detector, for example. Here, the control signal respectively involved for the adjustment or for the "centration of the spot position" can be used as the measurement signal ultimately relevant for determining the beam angle.

On account of the above-described adjustment, mechanically caused restrictions with respect to the control bandwidth of the adjustment are accepted as a matter of principle in the concept according to the disclosure (with an upper limit for mechanical adjustment ranging between 100 Hz and 1 kHz in this respect).

However, the disclosure can exploit the circumstances that the disturbances in position or beam direction of the light beam which, according to the disclosure, should ultimately be measured or "removed by closed-loop control" in a beam guiding unit typically observe a "$1/f^\alpha$ behavior" ($\alpha \geq 1$), and so comparatively small disturbances or amplitudes occur at relatively high frequencies, and vice versa. These circumstances have as a consequence that, firstly, disturbing influences with a large amplitude can be captured by way of the adjustment mechanism according to the disclosure on account of the comparatively low frequencies in this respect and, secondly, the measurement region (which, as set forth of the outset, is relatively small) of a light intensity sensor arrangement, e.g., in the form of a quadrant detector, itself can be used for disturbing influences at a higher frequency on account of the then comparatively small amplitudes, and so, as a result, the entire measurement range can be covered over a large bandwidth (which is only limited by the measurement bandwidth of the utilized quadrant detectors, which may lie in the GHz range, for example).

In the case of the above-described additional use of the measurement region of the light intensity sensor arrangement or the quadrant detector, the measurement signal ultimately relevant for the beam angle measurement arises from the control signal for adjustment purposes or for "centering the spot position" on the light intensity sensor arrangement, with the (residual) deviation of the spot on the light intensity sensor arrangement or the quadrant detector from the center thereof additionally being taken into account.

According to some embodiments, the light intensity sensor arrangement includes a beam splitter device for splitting the light beam onto the light intensity sensors. The beam splitter device can include a prism and, for example, be configured as a pyramidal prism in conjunction with a quadrant detector.

As will be described in more detail below, this configuration can take account of the fact that gaps remain for manufacturing reasons between the adjacent light intensity sensors in a light intensity sensor arrangement composed of a plurality of light intensity sensors, such as a quadrant detector, wherein the dimensions of these gaps might typically be of the order of (50-100) µm, with the consequence that without further measures a significant light portion falls in such gaps and consequently does not contribute to the measurement.

What can then be achieved by the use according to the disclosure of the aforementioned beam splitter device or prism, which itself can be processed or polished with a sharp edge, is that the relevant light components can be distributed in advance in the individual light intensity sensors of the light intensity sensor arrangement and do not even fall in the gaps, with, in turn, a lateral change in the point of incidence of the light beam on the beam splitter device leading to a change in the intensity values measured by the respective light intensity sensors. In the above-described configuration, the tip of the pyramid of the pyramidal prism, for example, can then be chosen as the specified location on the light intensity sensor arrangement with respect to which the intensity centroid of the light beam should maintain a substantially constant relative position.

The disclosure further relates to the use of an apparatus having the above-described features for monitoring an excitation laser beam in an EUV plasma source.

Further, the disclosure also relates to a method for measuring the beam angle of a light beam guided by a beam guiding optical unit, for example using an apparatus having the above-described features. The light beam is focused at a specified location of a light intensity sensor arrangement. A relative position of the intensity centroid of the light beam in relation to a specified location on the light intensity sensor arrangement is actively adjusted when there is a change in the beam angle present upon entry in the apparatus. The control signal respectively for adjustment purposes is used as measurement signal relevant to determining the beam angle.

Further configurations of the disclosure can be gathered from the description and the claims.

BRIEF DESCRIPTION OF THE DRAWINGS

The disclosure is explained in greater detail below on the basis of exemplary embodiments illustrated in the accompanying figures, in which.

DETAILED DESCRIPTION OF PREFERRED EMBODIMENTS

Figure 1:
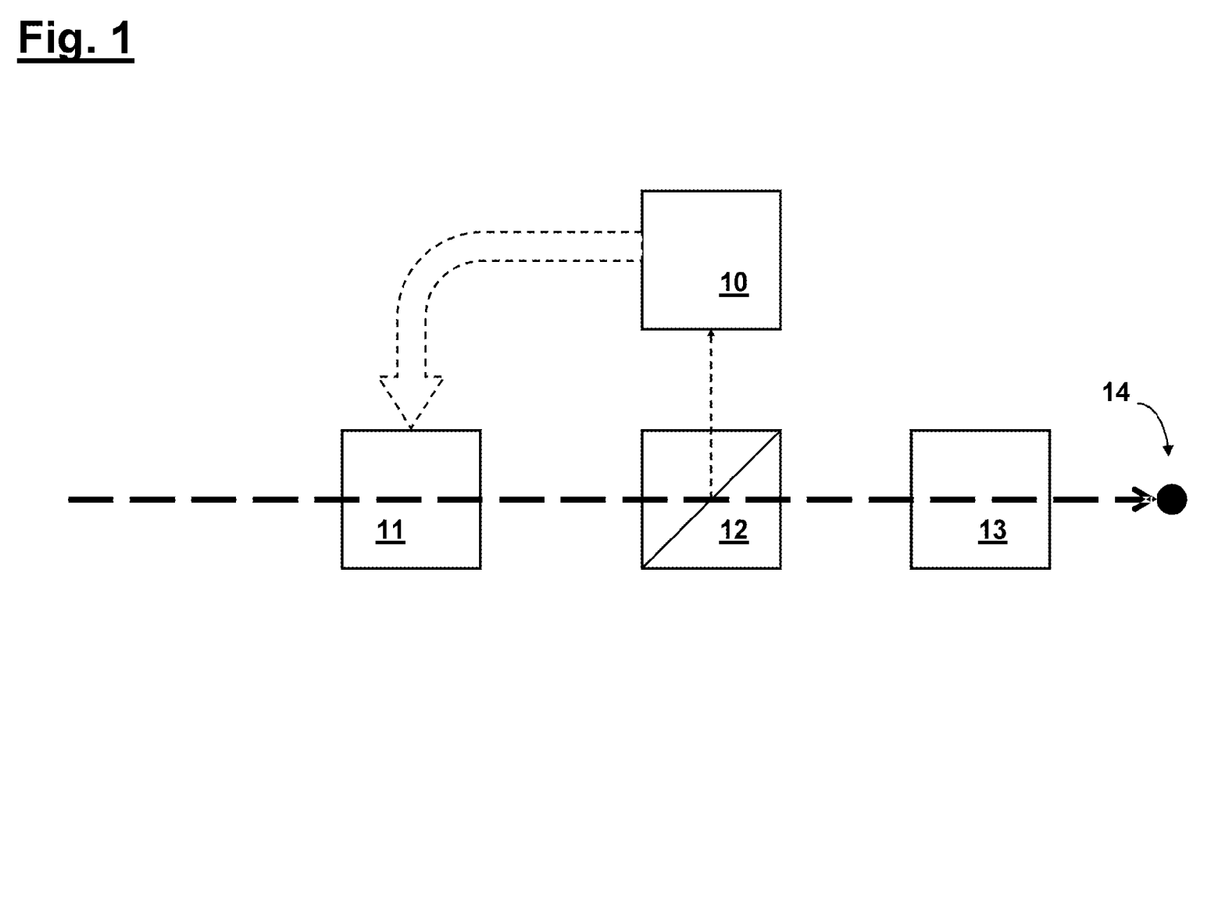
FIG. 1 shows a schematic illustration of the basic possible structure of a control device for a light beam.

FIG. 1 initially shows the basic structure of a control device for a light beam, which is able to be used, for example, for monitoring and controlling an excitation laser beam in an EUV plasma source yet to be described with reference to FIG. 8.

In accordance with FIG. 1, the light beam to be characterized and controlled with respect to its beam angle, which comes from a beam guiding device 11, initially strikes a beam splitter 12, where a measurement beam is diverted and supplied to an apparatus 10 according to the disclosure for measuring the beam angle. With respect to this apparatus 10, embodiments are described below with reference to the schematic drawings of FIG. 2 to FIG. 6.

The measurement signal characteristic for the beam angle of the light beam, supplied by the apparatus 10, is returned as control signal to the beam guiding device 11 in order thus to compensate present disturbances in the position or the beam angle of the light beam. In accordance with FIG. 1, the component of the light beam not diverted by the beam splitter 12 strikes a target 14 (e.g., in the form of a tin droplet in the EUV plasma source of FIG. 8) via a focusing optical unit 13 as a working beam.

Possible embodiments of an apparatus according to the disclosure for measuring the beam angle that correspond to the apparatus 10 of FIG. 1 are described below on the basis of FIG. 2 to FIG. 6.

Here, in each case analogous to the conventional arrangement of FIG. 7, the apparatus according to the disclosure includes a light intensity sensor arrangement with a plurality of light intensity sensors which in turn are each configured as quadrant detectors (e.g., four quadrant diode), without the disclosure being restricted thereto.

What is common to all of the embodiments according to the disclosure is that the "spot position" or the intensity centroid of the light beam on the light intensity sensor arrangement is adjusted or kept substantially constant relative to a specified location on the light intensity sensor arrangement (for example relative to the center of the respective quadrant detector).

Figure 2A:
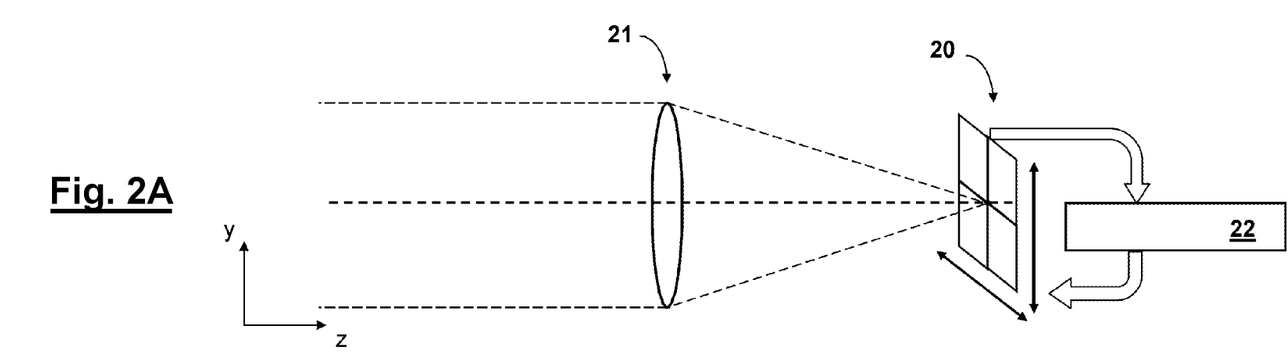
FIGS. 2A-2B show schematic illustrations for explaining the structure and functionality of an apparatus according to the disclosure for measuring the beam angle in a first embodiment.
Figure 2B:
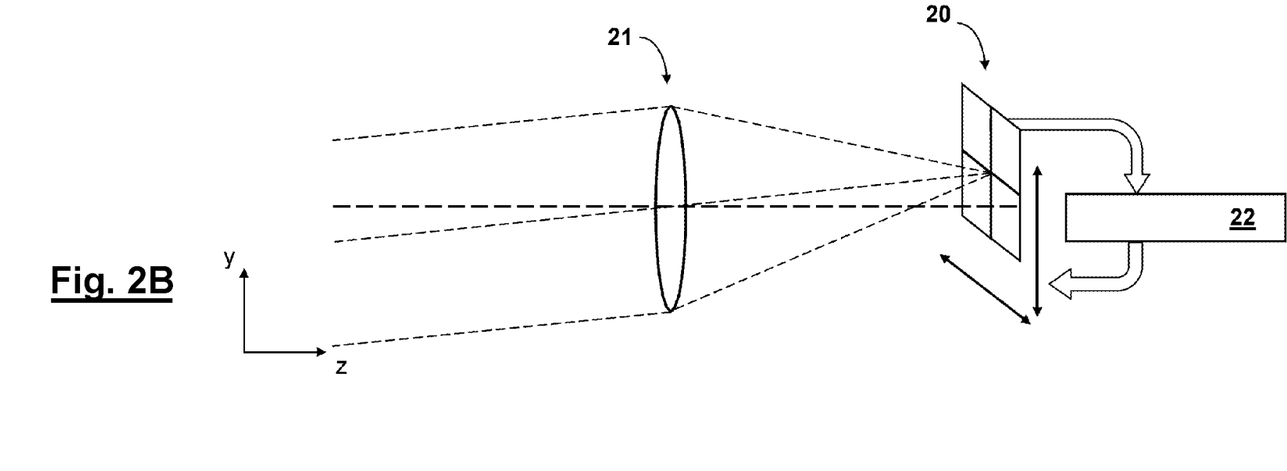

In accordance with FIGS. 2A-2B, an apparatus according to the disclosure includes, in a manner analogous to the conventional structure of FIG. 7, a light intensity sensor arrangement 20 in the form of a quadrant detector, which is arranged at the distance of one focal length from a focusing unit 21. "22" denotes a control unit or adjustment unit which, in the exemplary embodiment of FIGS. 2A-2B, maintains the relative position between, firstly, the spot or point of incidence of the light beam on the light intensity sensor arrangement 20 and the center thereof (corresponding to the "meeting point" of the individual light intensity sensors of the quadrant detector) up to a maximum deviation, which preferably corresponds to half the mean beam diameter upon incidence on the light intensity sensor arrangement, by manipulating the position of the light intensity sensor arrangement 20 (for example, the displacement thereof in the direction lateral to the light propagation direction, i.e., within the xy-plane in the plotted coordinate system) in response to the change in the beam angle.

This avoids the spot migrating from the measurement region of the quadrant detector, which already occurs for small changes in the beam angle in the conventional structure of FIG. 7. Moreover, the control signal of the adjustment unit 22 for the adjustment can be used as the measurement signal characteristic for the change in the beam angle. Additionally, a (residual) deviation of the spot on the light intensity sensor arrangement 20 or the quadrant detector can be taken into account when ascertaining this measurement signal since, as already described above, corresponding high-frequency disturbances with a comparatively low amplitude might not be able to be captured by way of the adjustment but can be captured over the measurement region of the quadrant detector.

Figure 3:
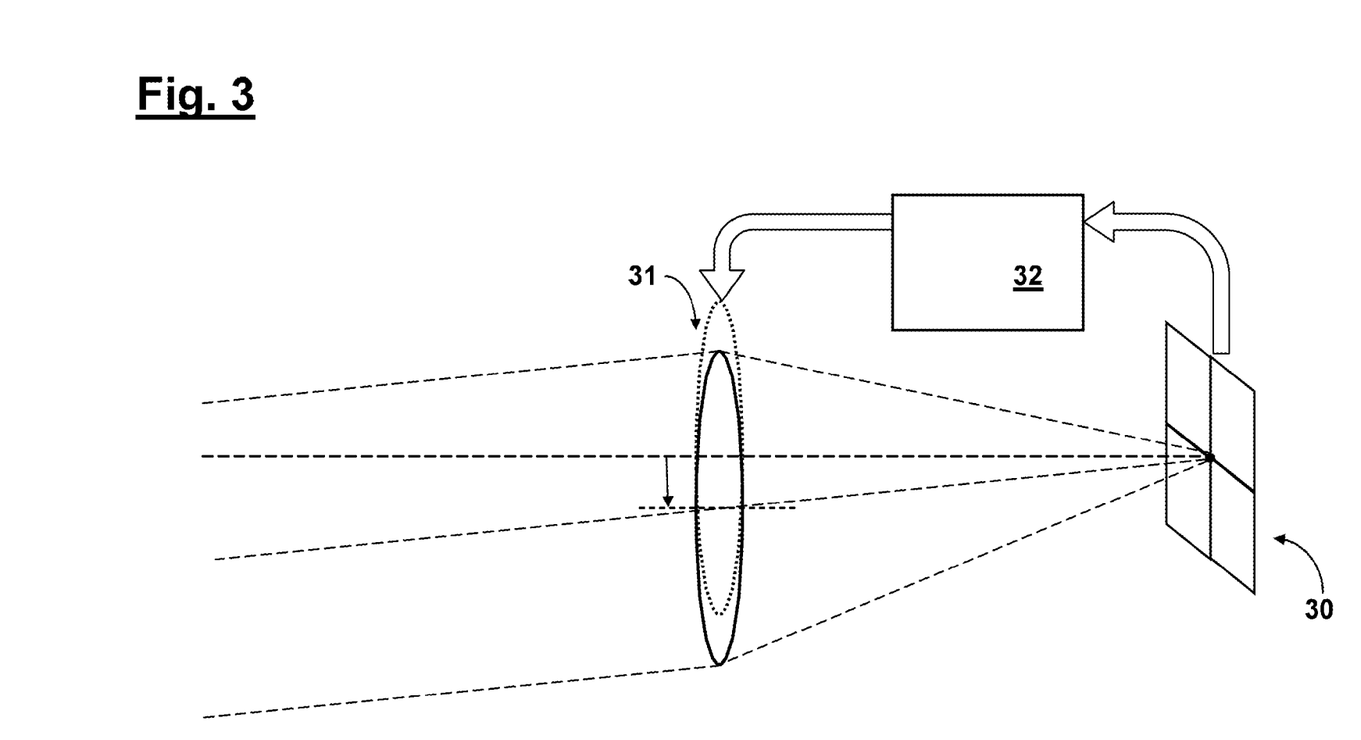
FIGS. 3-6 show schematic illustrations for elucidating further embodiments of an apparatus according to the disclosure.
Figure 4:
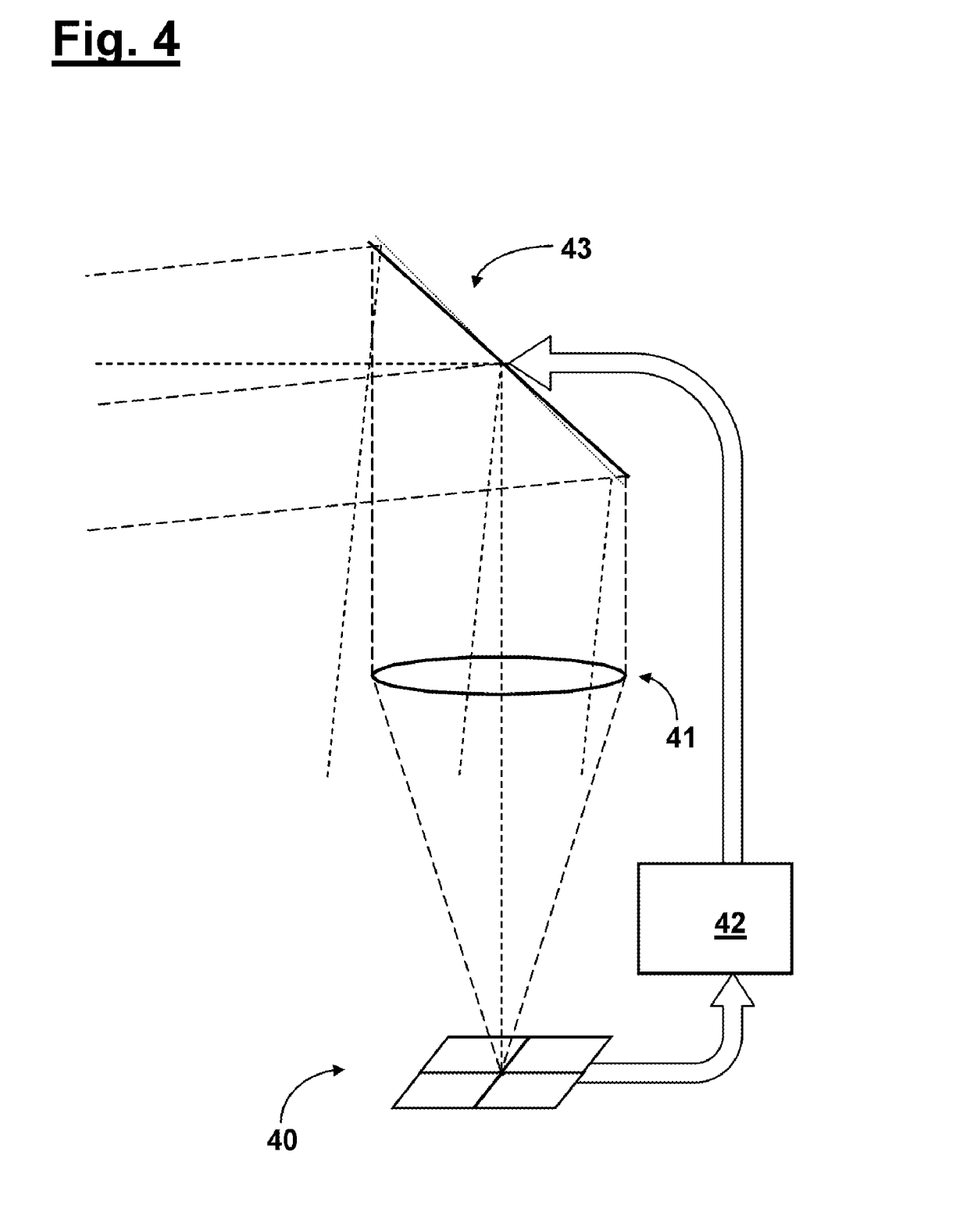

FIG. 3 and FIG. 4 show schematic illustrations of further possible embodiments of an apparatus according to the disclosure, wherein components which are analogous to, or substantially have the same function as, those in FIGS. 2A-2B are denoted by reference signs that are increased by "10" and "20", respectively.

Here, the embodiment of FIG. 3 differs from that of FIGS. 2A-2B in that, in accordance with FIG. 3, the position of the focusing unit 31 is manipulated by way the adjustment unit 32, as a result of which overall the relative position between, firstly, intensity centroid or spot and, secondly, center of the light intensity sensor arrangement 30 or the quadrant detector can be kept substantially constant.

In accordance with FIG. 4, the apparatus includes an additional deflection optical unit 43, e.g., in the form deflection mirror, in the optical beam path, with the adjustment unit 42 in this case being designed to manipulate the position of this deflection optical unit 43.

Piezoelectric ultrasonic drives can be suitable for realizing the above-described position manipulation by way of the respective adjustment unit on account of their comparatively small mechanical dimensions, their low weight, and their advantageous dynamic properties with respect to achievable speeds and accelerations. However, the disclosure is not restricted thereto and so, for the position manipulation, other actuators, for example in the form of spindle drives or electromagnetic drives with linear motors, Lorenz actuators, etc., can also be used to actively adjust the respective element (i.e., the light intensity sensor arrangement, the focusing unit and/or a deflection device).

Figure 5:
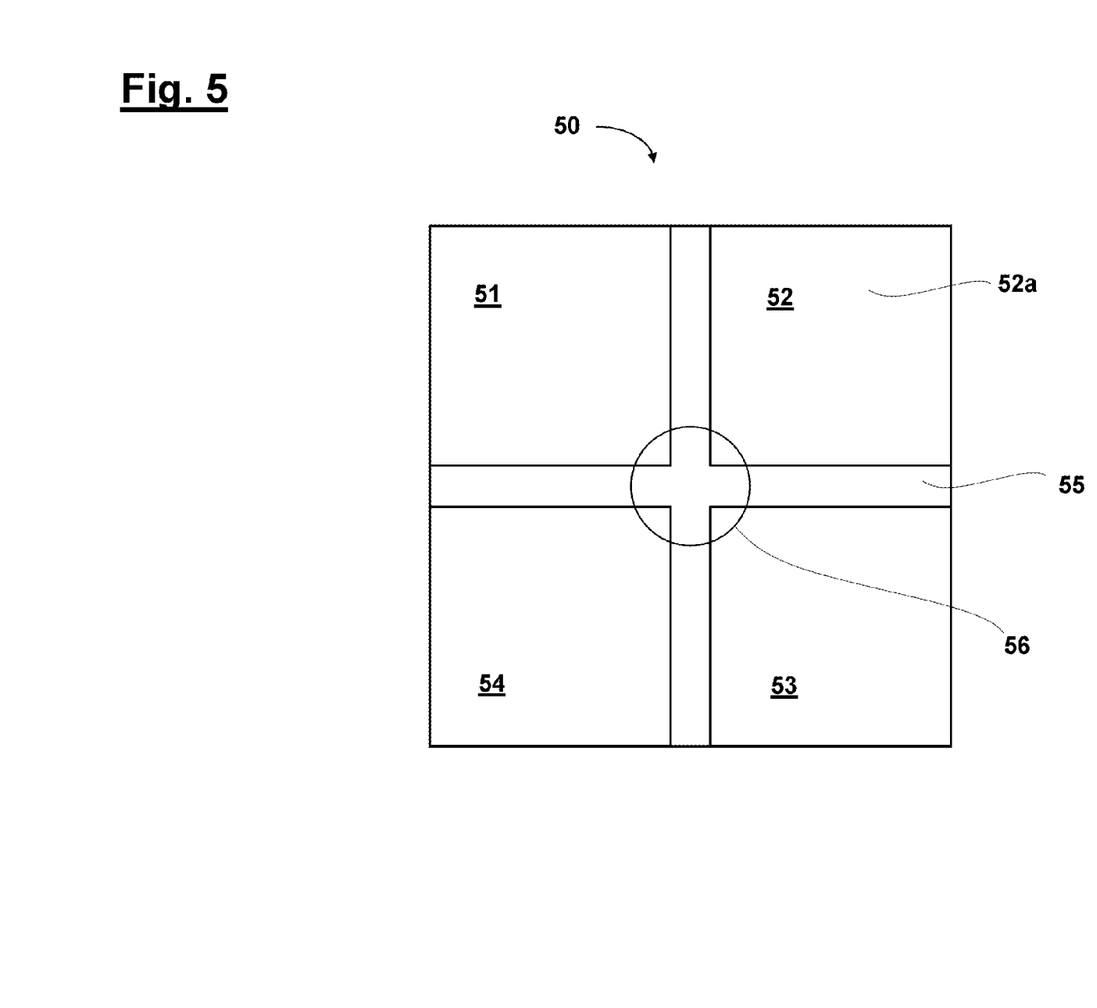

In further embodiments of the disclosure, the presence of manufacturing related gaps between the individual light intensity sensors and the circumstances that without further measures a significant component of the light beam to be characterized with respect to its beam angle strikes these gaps and does not contribute to the measurement signal is taken into account by a suitable configuration of the light intensity sensor arrangement. The schematic illustration of FIG. 5 serves to elucidate this situation, wherein the gap region remaining between the light intensity sensors 51-54 of a light intensity sensor arrangement 50 in the form of a quadrant detector is denoted by "55". The typical gap dimensions can be of the order of (50-100) µm and, as indicated in FIG. 5, have a size comparable to the size of the spot of the light beam 56.

Figure 6:
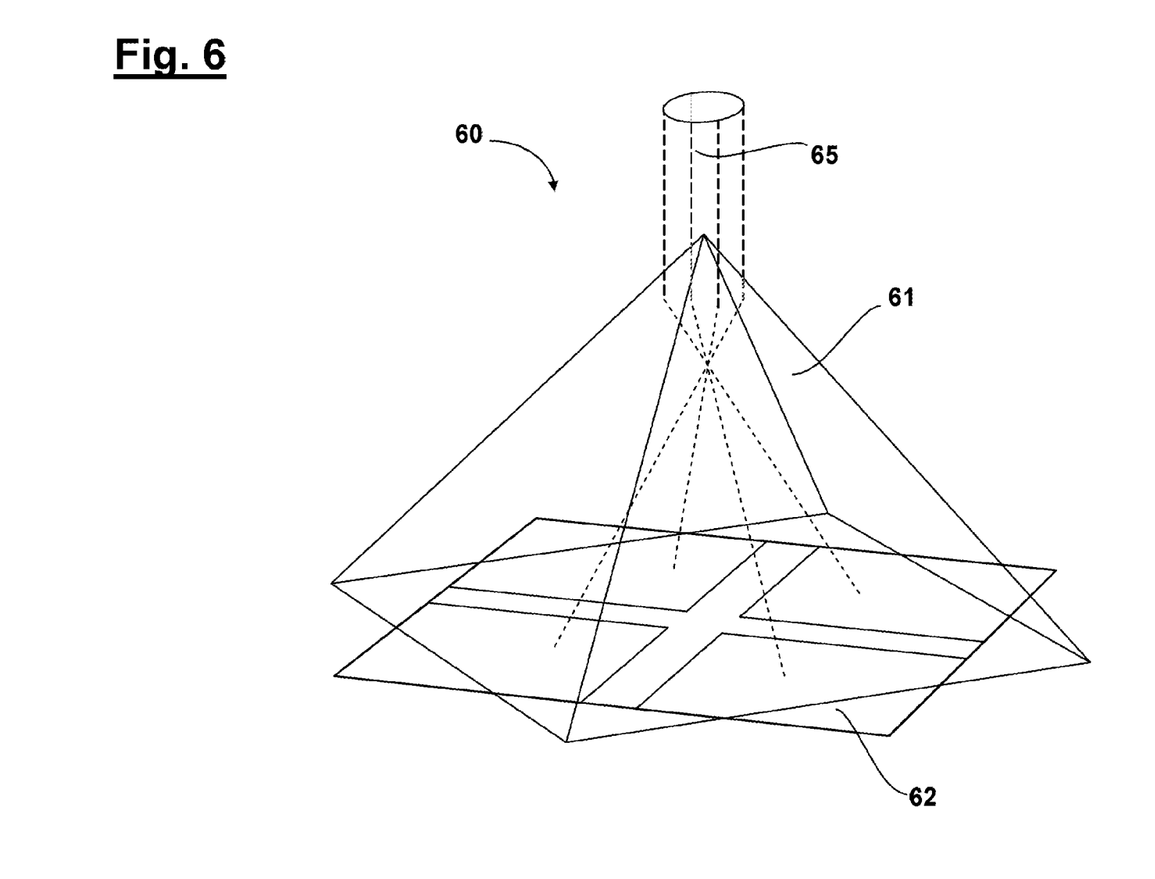

To overcome this problem, a light intensity sensor arrangement 60 according to the disclosure includes a beam splitter device 61 disposed upstream in the optical beam path in the embodiment of FIG. 6, the beam splitter device being configured as a pyramidal prism in the specific exemplary embodiment and splitting an incident light beam, which is represented as a beam tube 65, into the individual light intensity sensors 62. Since the edges of the prism forming the beam splitter device 61 can be polished to have a sharp edge (typical to an edge sharpness of less than 1 µm), the above-described light losses are accordingly avoided and the entire intensity of the light beam is utilized in the measurement according to the disclosure.

Figure 8:
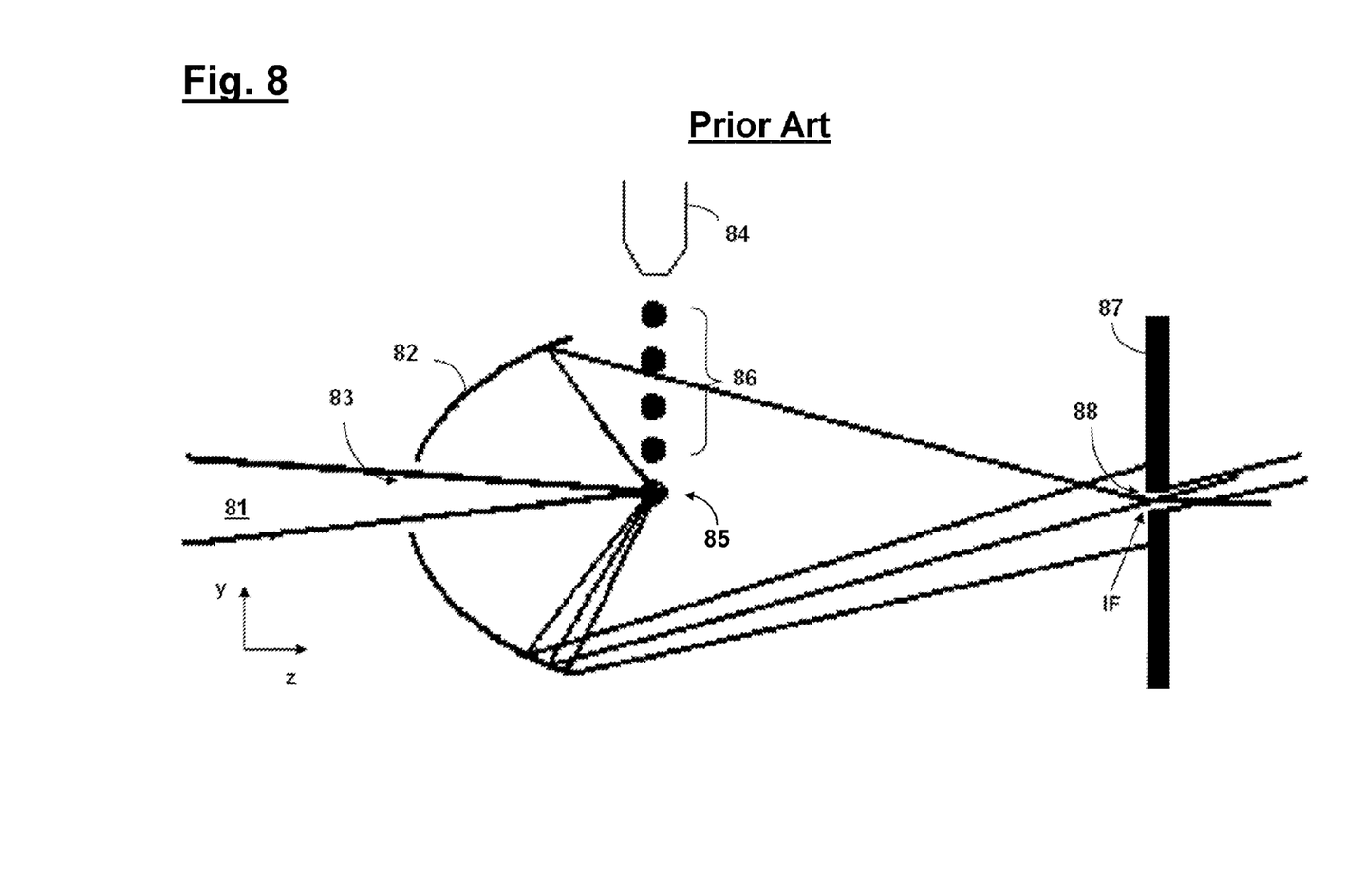
FIG. 8 shows a schematic illustration of the basic structure of an EUV plasma source.

As a possible application of the disclosure, FIG. 8 shows a conventional structure of a laser plasma source, for example for use in lithography for generating the EUV light for a projection exposure apparatus designed for the EUV range (e.g., wavelengths of approximately 13 nm or approximately 7 nm, for example).

This EUV light source includes a high-energy laser (not shown here), for example for generating infrared radiation 81 (e.g., $CO_2$ laser with a wavelength of 10.6 µm), the infrared radiation being focused by way of a focusing optical unit, passing through an opening 83 present in a collector mirror 82 embodied as an ellipsoid and, as an excitation beam, being steered at a target material 86 (e.g., tin droplets) which is generated via a target source 84 and supplied to a plasma ignition position 85. The infrared radiation 81 heats the target material 86 situated in the plasma ignition position 85 in such a way that the target material transitions into a plasma state and emits EUV radiation. This EUV radiation is focused by way of the collector mirror 82 onto an intermediate focus IF and enters through the latter into a downstream illumination device, the edge 87 of which is merely indicated and which has a free opening 88 for the light entrance.

What is of substantial importance for the dose stability or time stability of the EUV emission characteristic achievable in an EUV light source or laser plasma source and for the realizable EUV luminous efficiency is that the tin droplets "flying into" the laser plasma source very quickly (e.g., with an injection rate in the region of 100 kHz or with a time interval of, e.g., 10 µs) with increasing desired light properties are hit individually in a highly precise (e.g. with an accuracy of more than 1 μm) and reproducible manner by the laser beam atomizing the droplet. In the aforementioned structure, this in turn involves highly accurate setting of the droplet position and highly accurate tracking of the infrared radiation 83 generated by e.g. the $CO_2$ laser. Consequently, the apparatus according to the disclosure can be used to monitor or measure the beam angle of the corresponding excitation beam generated by the $CO_2$ laser in the structure already described on the basis of FIG. 1.

Even though the disclosure has been described on the basis of specific embodiments, numerous variations and alternative embodiments will be apparent to a person skilled in the art, for example through combination and/or exchange of features of individual embodiments. Accordingly, it goes without saying for a person skilled in the art that such variations and alternative embodiments are also encompassed by the present disclosure, and the scope of the disclosure is only restricted as provided by the appended patent claims and the equivalents thereof.

What is claimed is:

1. An apparatus, comprising:
    a light intensity sensor arrangement;
    a focusing unit configured to focus a light beam at a specified location on the light intensity sensor arrangement; and
    an adjustment unit configured to adjust a relative position of an intensity centroid of the light beam in relation to the specified location on the light intensity sensor arrangement when there is a change in a beam angle present upon entry in the apparatus,
    wherein the adjustment unit is configured to keep the relative position of the intensity centroid of the light beam in relation to the specified location on the light intensity sensor arrangement constant up to a deviation corresponding to half a mean beam diameter upon incidence on the light intensity sensor arrangement.

2. The apparatus of claim 1, wherein the adjustment unit comprises a manipulator configured to manipulate a position of at least one member selected from the group consisting of the light intensity sensor arrangement and the focusing unit.

3. The apparatus of claim 1, further comprising a deflection optical unit configured to deflect the light beam before reaching the light intensity sensor arrangement, wherein the adjustment unit comprises a manipulator configured to manipulate at least one member selected from the group consisting of a tilt angle of the deflection optical unit and a position of the deflection optical unit.

4. The apparatus of claim 1, wherein the light intensity sensor arrangement comprises a plurality of light intensity sensors.

5. The apparatus of claim 4, wherein, for each light intensity sensor, the specified location on the light intensity sensor arrangement adjoins the light intensity sensor.

6. The apparatus of claim 4, wherein the light intensity sensor arrangement comprises a beam splitter device configured to split the light beam onto the light intensity sensors.

7. The apparatus of claim 6, wherein, for each light intensity sensor, the specified location on the light intensity sensor arrangement adjoins the light intensity sensor.

8. The apparatus of claim 6, wherein the beam splitter device comprises a prism.

9. The apparatus of claim 1, wherein the light intensity sensor arrangement comprises a quad-rant detector, and the specified location on the light intensity sensor arrangement corresponds to a center of this quadrant detector.

10. The apparatus of claim 1, wherein the light beam comprises a laser beam.

11. The apparatus of claim 1, wherein the light beam comprises an infrared laser beam.

12. The apparatus of claim 1, wherein:
    the adjustment unit comprises a manipulator configured to manipulate a position of at least one member selected from the group consisting of the light intensity sensor arrangement and the focusing unit;
    the apparatus further comprises a deflection optical unit configured to deflect the light beam before reaching the light intensity sensor arrangement; and
    the adjustment unit comprises a manipulator configured to manipulate at least one member selected from the group consisting of a tilt angle of the deflection optical unit and a position of the deflection optical unit.

13. The apparatus of claim 12, wherein the light intensity sensor arrangement comprises a plurality of light intensity sensors.

14. The apparatus of claim 1, wherein:
    the adjustment unit comprises a manipulator configured to manipulate a position of at least one member selected from the group consisting of the light intensity sensor arrangement and the focusing unit; and
    the light intensity sensor arrangement comprises a plurality of light intensity sensors.

15. The apparatus of claim 1, wherein:
    the adjustment unit comprises a manipulator configured to manipulate a position of at least one member selected from the group consisting of the light intensity sensor arrangement and the focusing unit;
    the light intensity sensor arrangement comprises a quad-rant detector; and
    the specified location on the light intensity sensor arrangement corresponds to a center of this quadrant detector.

16. The apparatus of claim 1, further comprising a deflection optical unit configured to deflect the light beam before reaching the light intensity sensor arrangement, wherein the adjustment unit comprises a manipulator configured to manipulate at least one member selected from the group consisting of a tilt angle of the deflection optical unit and a position of the deflection optical unit, and the light intensity sensor arrangement comprises a plurality of light intensity sensors.

17. The apparatus of claim 1, further comprising a deflection optical unit configured to deflect the light beam before reaching the light intensity sensor arrangement, wherein:
    the adjustment unit comprises a manipulator configured to manipulate at least one member selected from the group consisting of a tilt angle of the deflection optical unit and a position of the deflection optical unit;
    the light intensity sensor arrangement comprises a quad-rant detector; and
    the specified location on the light intensity sensor arrangement corresponds to a center of this quadrant detector.

18. The apparatus of claim 1, wherein:
    the adjustment unit comprises a first manipulator configured to manipulate a position of at least one member selected from the group consisting of the light intensity sensor arrangement and the focusing unit;
    the apparatus further comprises a deflection optical unit configured to deflect the light beam before reaching the light intensity sensor arrangement;
    the adjustment unit comprises a second manipulator configured to manipulate at least one member selected from the group consisting of a tilt angle of the deflection optical unit and a position of the deflection optical unit;

the light intensity sensor arrangement comprises a plurality of light intensity sensors; and the light intensity sensor arrangement comprises a quadrant detector, and the specified location on the light intensity sensor arrangement corresponds to a center of this quadrant detector.

19. A system, comprising:
an EUV plasma source; and
an apparatus according to claim 1,
wherein the apparatus is configured to an excitation laser beam in the EUV plasma source.

20. A method, comprising:
focusing a light beam at a specified location of a light intensity sensor arrangement;
actively adjusting a relative position of an intensity centroid of the light beam in relation to a specified location on the light intensity sensor arrangement when there is a change in the beam angle present upon entry in the apparatus; and
keeping the relative position of the intensity centroid of the light beam in relation to the specified location on the light intensity sensor arrangement constant up to a deviation corresponding to half a mean beam diameter upon incidence on the light intensity sensor arrangement.

* * * * *

UNITED STATES PATENT AND TRADEMARK OFFICE
CERTIFICATE OF CORRECTION

| | | |
|---|---|---|
| PATENT NO. | : 11,737,199 B2 | Page 1 of 1 |
| APPLICATION NO. | : 17/217295 | |
| DATED | : August 22, 2023 | |
| INVENTOR(S) | : Florian Baumer and Matthias Manger | |

It is certified that error appears in the above-identified patent and that said Letters Patent is hereby corrected as shown below:

In the Specification

Column 1, Line 24, delete "applies cations" insert -- applications --.

Signed and Sealed this
Tenth Day of October, 2023

Katherine Kelly Vidal
*Director of the United States Patent and Trademark Office*